United States Patent [19]

Tsukada

[11] Patent Number: 5,355,580

[45] Date of Patent: Oct. 18, 1994

[54] METHOD FOR REPLACING SEMICONDUCTOR CHIPS

[75] Inventor: Yutaka Tsukada, Shiga, Japan

[73] Assignee: International Business Machines, Armonk, N.Y.

[21] Appl. No.: 976,619

[22] Filed: Nov. 16, 1992

[30] Foreign Application Priority Data

Dec. 26, 1991 [JP] Japan .................................. 3-344822

[51] Int. Cl.⁵ .............................................. H05K 3/39
[52] U.S. Cl. ...................................... 29/840; 29/426.1; 29/426.4; 174/260
[58] Field of Search .................... 29/830, 426.1, 426.5, 29/426.4, 840; 174/260

[56] References Cited

FOREIGN PATENT DOCUMENTS 58-48932 3/1983 Japan .
62-276837 12/1987 Japan .

OTHER PUBLICATIONS

IBM Technical Disclosure Bull., vol. 19 No. 7 Dec. 1976, p. 2477 by P. A. Angelone.

Western Electric Tech. Digest No. 15, Jul. 1969, pp. 27-28 by J. E. Clark et al.

IBM Technical Disc. Bulletin, vol. 24, No. 2, Jul. 1981, pp. 1288-1289.

IBM Technical Disc. Bulletin, vol. 19, No. 5, Oct. 1976 pp. 1641-1642.

IBM Technical Disc. Bulletin, vol. 21, No. 12 May 1979, p. 4835.

IBM Technical Disc. Bulletin, vol. 28, No. 7, Dec. 1985 p. 3018.

*Primary Examiner*—Carl J. Arbes
*Attorney, Agent, or Firm*—Michael E. Belk

[57] ABSTRACT

A face-down bonded semiconductor chip 4 encapsulated with a resin 14 is removed from the substrate 2 with a cutting end mill 26. The resin 14 and bump electrodes 6 remaining on the substrate 2 are then cut with a finishing end mill to a height of about one half of the original height to planarize the surface. Another chip 4A having bump electrodes 6A is aligned with the bump electrodes 6 on the substrate 2, and bonded face down on the substrate. Finally, resin 14A is flowed into the gap between the chip 4A and the substrate 2 and around the chip 4A to encapsulate the chip.

7 Claims, 3 Drawing Sheets

METHOD FOR REPLACING SEMICONDUCTOR CHIPS

FIELD OF THE INVENTION

This invention relates to methods for replacing a semiconductor chip bonded face down to a substrate and encapsulated by a resin and the resulting circuit boards.

BACKGROUND

In the direct chip attachment (DCA) packaging systems, chips must be replaced if defective chips are found after bonding semiconductor chips on a circuit substrate, or in the case of an engineering change (EC). When chips are face-down bonded using solder bumps and are not resin-encapsulated, the chips may be removed with ease from the substrate by heating the chips to melt the solder bumps.

As shown in FIG. 1, however, when the space between the substrate 2 and the bottom surface of the chip 4 is filled with a resin such as epoxy resin to encapsulate the chip, problems arise. That is, the resin adheres to the chip 4 and the substrate 2, and thus the chip and the resin cannot be removed with ease. If one attempts to forcedly remove the chip and the resin, the substrate or the circuit on the substrate may be damaged and cannot be reused.

Japanese Published Unexamined Patent Application (Patent Kokai) 58-48932 discloses a technique to facilitate the replacement of resin-encapsulated chips in which the surface of a substrate such as glass is coated with a layer of a material such as a silicone resin which does not adhere well to the encapsulation resin in order to prevent the adhesion of the encapsulation resin to the substrate. Chip bumps are connected to electrode pads on the substrate through openings in the resin layer. However, due to weak adhesion between the encapsulation resin and the substrate, this method involves some problems such as insufficient encapsulation and poor mechanical strength of the bond between the chips and the substrate.

Alternatively, a method can be considered in which an encapsulation resin is treated with chemicals such as a solvent to dissolve or decompose it. However, this method has various problems. First, the substrate and components may be affected adversely by the chemicals. Also, in order to subject only a selected chip to the chemical treatment, the chips must be mounted spaced apart from each other by a required distance, and thus the chip density is limited. Furthermore, since the distance between the chip and the substrate is as small as, for example, 0.1 mm, it is difficult to remove the resin by introducing the chemicals into this space, increasing treatment time.

Furthermore, when a chip bonded face down by bump electrodes such as solder bumps is removed, the bump electrodes are destroyed. In replacing a chip, therefore, proper bump connections must be reconstructed. Also, when a resin encapsulated chip is removed, the resin encapsulation is also damaged and thus it must be done again. These operations must be easily performed, and the reliability of the replacement chip must be maintained.

SUMMARY OF THE INVENTION

Therefore, it is an object of this invention to provide a method for replacing a semiconductor chip, which is capable of replacing a chip relatively easily without causing mechanical and chemical damages to the substrate or circuits and components formed on the substrate and still capable of maintaining the reliability of the new chip even after the replacement.

The method of this invention is based on the idea of intentionally leaving on the substrate a part of the encapsulation resin and a part of the bump electrodes enclosed in the resin, instead of forcedly peeling or removing all the encapsulation resin of a semiconductor chip to be replaced. The encapsulation resin and the bump electrodes are left in the form of a mesa-like base or pedestal to minimize the damage on the substrate side and to help maintain reliability after replacement, and then another chip is bonded on the base.

According to this invention, a chip is first mechanically removed from the substrate. Preferably, this is performed by milling. Then, the encapsulation resin and the bump electrodes enclosed therein are cut or ground to a predetermined height to planarize their surface. It is preferred that this cutting is also performed by milling. Then, another chip is bonded to the flattened remains of the original bump electrodes on the substrate through the use of a new set of other bump electrodes. Finally, the space between the bottom surface of the chip and the substrate is filled with a resin.

Figure 1:
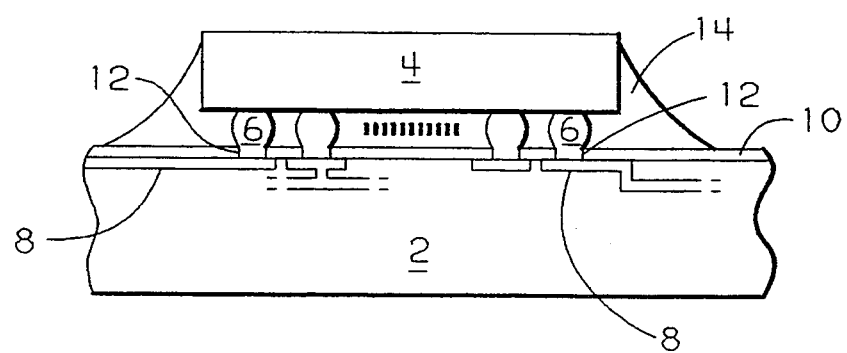
FIG. 1 shows a face-down bonded and resin encapsulated chip.

2 Substrate
4, 4A Chip
6, 6A High Melting point solder bump
8 Wiring conductor
10 Epoxy resin layer
12 Opening
14, 14A Encapsulation resin
16 Low melting point solder
18 Dispensing needle
20 Router
22 X-Y stage
24 Spindle
26 End mill
28 Control/drive unit

DETAILED DESCRIPTION OF THE DRAWINGS

Referring now to drawings, a preferred embodiment of this invention is described. FIG. 1–FIG. 5 illustrates the steps for replacing a chip according to this invention. FIG. 1 shows an example of a resin-encapsulated semiconductor chip 4 to be replaced. In this embodiment, the chip 4 is bonded face down to a printed circuit substrate 2 by bump electrodes 6 formed of solder. The substrate 2 may be any known substrate. In this embodiment, it is an epoxy impregnated fiber glass substrate. The solder bumps 6 are made of a high melting point solder consisting of, for example, 3–5% tin and 95–97% lead. In this embodiment, it is a solder with a melting point of 325° C. consisting of 3% tin and 97% lead. Wiring conductors 8 are formed on the surface of the substrate 2. The wiring conductors 8 are coated with a photosensitive epoxy resin layer 10 in which openings 12 for exposing the bump connection regions are formed. The solder bumps 6 are connected to the wiring conductors 8 through the openings 12.

The chip 4 is spaced from the surface of the substrate 2 by the height of the solder bumps 6. The distance between the bottom surface of the chip 4 and the top surface of the substrate 2 is about 0.1 mm. The chip 4 is encapsulated by a thermosetting resin 14. The resin 14 may be, for example, a liquid bisphenol-A type epoxy resin marketed by Matsushita Electric Works, Ltd., under the trade name of CV5183 and CV5183S. Such an epoxy resin has a glass transition temperature of 127° C., and a coefficient of thermal expansion of 45 ppm. The resin 14 fills the space between the chip 4 and the substrate 2. The epoxy resin bonds the chip 4 to the resin layer 10 on the surface of the substrate 2, and at the same time, seals the periphery of the chip 4.

Figure 2:
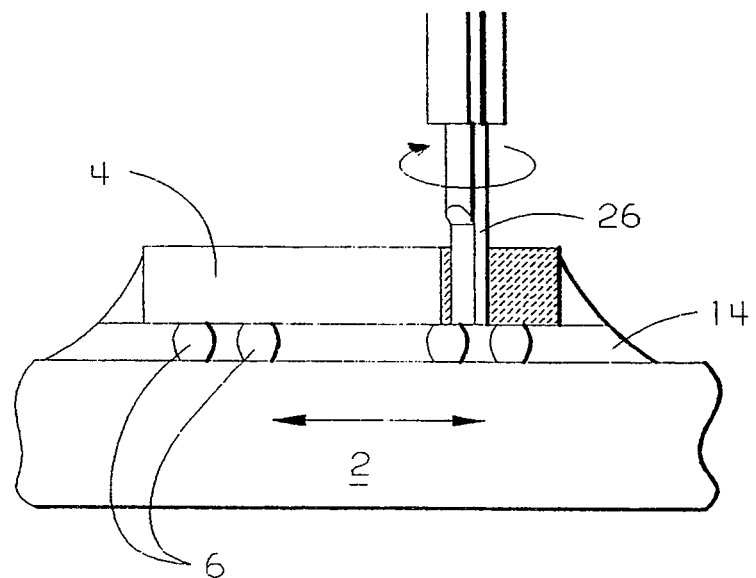
FIG. 2 shows the milling of the semiconductor chip for removing the chip in the invention.

When a defective chip is replaced, or when an engineering change (EC) is carried out, the chip must first be removed. The removal of the chip 4 from the substrate 2 is preferably performed by mechanically cutting the chip 4 by milling as shown in FIG. 2.

Figure 6:
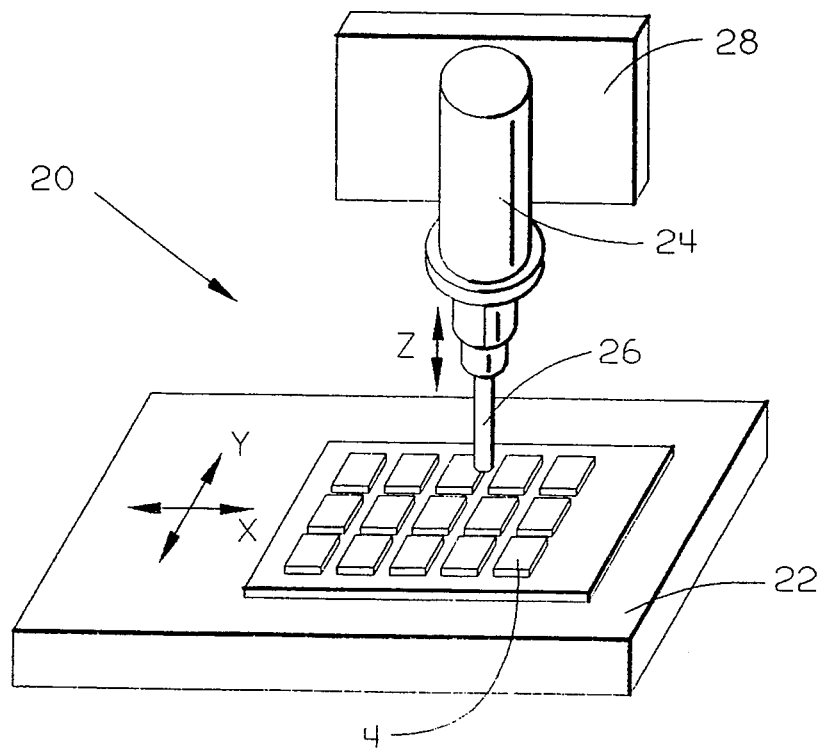
FIG. 6 shows the milling of the invention.

FIG. 6 shows an outline of the milling operation. The substrate 2 on which chips 4 are mounted is placed on the X-Y stage 22 of a machining router 20 (a PHR Series router marketed by Rokuroku Sangyo Co., Ltd., Shizuoka, Japan), and held on the stage 22 by vacuum. An end mill 26 is attached at the end of the spindle 24. As the end mill 26, an RTZ Series half-moon type diamond cutter with a diameter of 1.1 mm, manufactured by Union Tool Co., Ltd., Tokyo, Japan, was used. The cutter is substantially semicircular in cross-section, and diamond abrasive grains are implanted in its tip and side. On cutting, the X-Y stage 22 is controlled to locate the end mill 26 close to the chip 4 to be removed. The position of the spindle 24 in the Z direction is adjusted by a control/drive unit 28 so that the bottom end of the end mill 26 is at almost the same level as the bottom surface of the chip. The X-Y stage 22 is reciprocated while rotating the end mill 26 at high speed to cut the chip 4.

The chip cutting is continued until the chip is completely removed. It has been found that milling can be used effectively for the removal of the chip. The substrate was not damaged by mechanical impact or vibration due to milling since the encapsulation resin 14 strongly adheres to the surface of the substrate and the entire solder bumps 6 are firmly held by the encapsulation resin 14. With the milling, a chip 12 mm×12 mm×0.8 mm in size could be removed in about 90 seconds.

Alternatively, tile chip may be removed by heating. In this case, the substrate is placed in an oven and heated to a temperature higher than the glass transition temperature of the encapsulation resin to soften the resin. Since the glass transition temperature of the epoxy resin used is 127° C., the substrate is heated to, for example, 140° C. A scriber is inserted under the chip to peel the chip. Since the adhesion strength of the epoxy resin to the chip is not high, the chip may be removed. Another method is to hold the chip with a gripper after heating and to rotate the chip. However, the scriber and chip rotation methods may damage the resin and solder bumps left on the substrate. If the entire surface of the chip is encapsulated, these methods are difficult to use. Therefore, milling is preferable for removing the chip.

Figure 3:
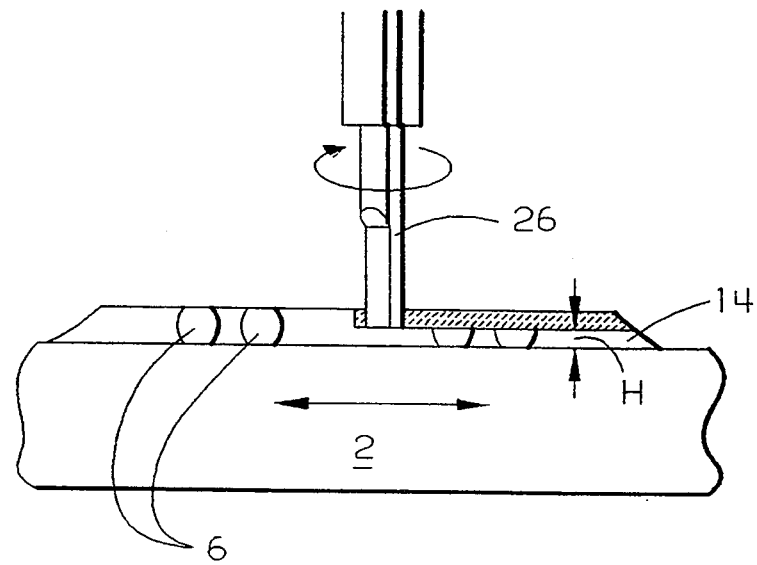
FIG. 3 shows planarizing the surface by cutting the resin layer and solder bumps by milling in the invention after removing the chip.

The next step is, as FIG. 3 shows, to planarize the surface by mechanically removing upper portions of the resin layer 14 and the solder bumps 6 remaining on the substrate. This may be performed by cutting or grinding the surface of the resin using a finishing end mill instead of the end mill for chip cutting described above. As this finishing end mill, an SM Series half-moon type carbide cutter with a diameter of 1.0 mm, manufactured by Union Tool Co., Ltd., Tokyo, Japan, was used. The height of the remaining resin layer and solder bumps, H, is preferably about 50% or more of the original height of the solder bumps that is the distance between the substrate 2 and the bottom surface of the chip. If the resin layer is cut too deeply, the solder bump holding force of the resin layer is weakened, resulting in peeling off of the solder during the milling and accompanying damage of the underlying electrode pads. It is preferred, therefore, that the cutting is performed so that a half or more of the height of the solder bumps is left. Although there is no upper limit in the height of the remaining resin layer and solder bumps if the cut surface is flat, the height is normally about 70% of the original height of the solder bumps. After the resin is cut, the substrate is cleaned with water.

Next, a low melting point solder is deposited on the solder bumps left on the substrate. This low melting point solder is, for example, an eutectic solder formed of 63% tin and 37% lead. The deposition of the low melting point solder may be performed by any suitable method such as transferring the solder formed on a carrier by electroplating onto the substrate, or extruding molten solder from a nozzle onto the substrate. The low melting point solder may be deposited on either one or both of the high melting point solder bumps of a new chip to be mounted, and the solder bumps remaining on the substrate. Of course, any suitable solder may be used as the high melting point and low melting point solders.

Figure 4:
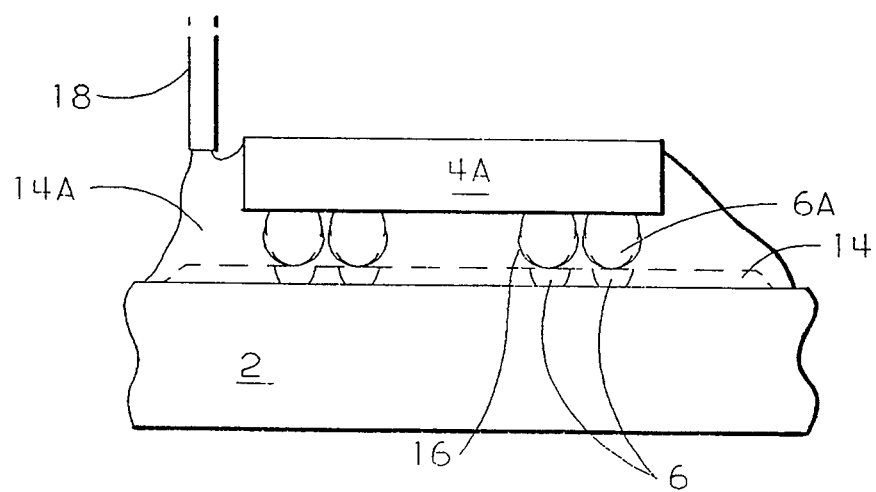
FIG. 4 shows encapsulation with resin in the invention after replacing the chip.

Next, a new chip is positioned so that the solder bumps of the chip are aligned with the solder bumps on the substrate. The substrate is heated to a temperature higher than the melting point of the low melting solder but lower than the melting point of the high melting solder to reflow the low melting solder. Thus, the new chip is bonded face down on the substrate. In FIG. 4, the high melting point solder bumps 6A of a new chip 4A is bonded to the hemispherical high melting point solder bumps 6 with the low melting solder 16.

Figure 5:
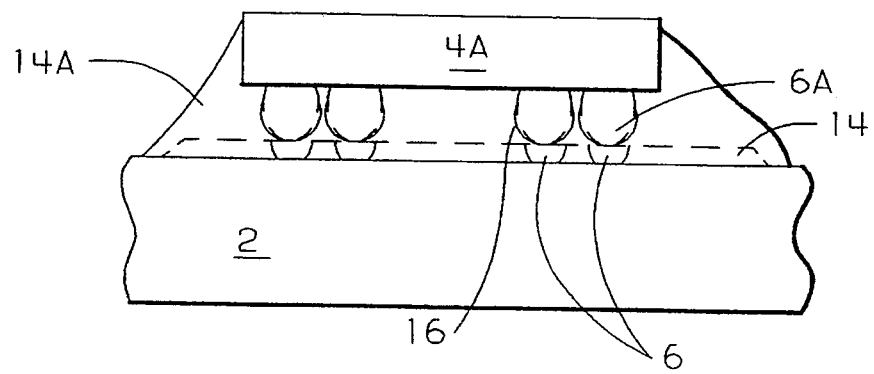
FIG. 5 shows the final structure of the invention after replacing the chip.

Finally, as FIG. 4 shows, the dispensing needle 18 of a commercially available resin dispenser is moved along the edge of the chip to allow the epoxy resin 14A described above to penetrate between the bottom surface of the chip and the substrate by capillary action, and at the same time, the periphery of the chip is coated with the resin. After supplying a predetermined amount of the resin, the substrate was heated in an oven at a temperature of 120° C. for 2 and half hours to cure the resin. This results in the final structure as shown in FIG. 5.

Although a particular embodiment has been described herein, this invention is not limited thereto. For example, although a high melting point solder was used as the bump electrodes, gold bumps or gold-coated copper bumps may also be used. Also, although a vertical end mill placed vertically to the surface of the substrate was used as the milling tool, a horizontal end mill placed in parallel with the surface of the substrate may be used. Furthermore, the method of this invention may be used for replacing any resin encapsulated chip using any suitable resin such as novolak type epoxy resin, phenolic resin, polyurethane, and filled silicone.

According to this invention in which a part of the encapsulation resin and bump electrodes is intentionally left and used as the base for mounting a new chip, the chip can be replaced easily with minimum mechanical and chemical damage to the substrate. Especially when milling is used, the chip can be removed in a relatively short time, and this method can be used in any form of resin encapsulated chip. Also, by the use of the method in which the surface of the encapsulation resin and bump electrodes is planarized, the height of the bump electrodes left on the substrate can be made uniform, allowing reliable connection of the new chip. The use of low melting and high melting point solders ensures reliable chip connection. Furthermore, since the height of the bump electrodes increases to about 1.5 times that of conventional bump electrodes, the resistance to thermal stress is improved, and the replaced chip can easily be distinguished by the difference in height, thus facilitating subsequent maintenance and tests.

I claim:

1. A method for replacing a semiconductor chip bonded face down to a substrate by bump electrodes with the space between the bottom surface of said semiconductor chip and said substrate being filled with an encapsulation resin, comprising the steps of:

mechanically removing said chip from said substrate;
   planarizing the surface of said resin and said bump electrodes remaining on said substrate;
   bonding another chip to the bump electrodes on said substrate through the use of other bump electrodes; and
   filling the space between the bottom surface of said another chip and said substrate with an encapsulation resin.

2. The method for replacing a semiconductor chip as claimed in claim 1, in which the removal of said chip is accomplished by milling.

3. The method for replacing a semiconductor chip as claimed in claim 1, in which said planarizing is performed by milling.

4. The method for replacing a semiconductor chip as claimed in claim 3, in which said milling is performed such that the height of said resin and bump electrodes left on said substrate is about half or more the original height of the bump electrodes.

5. The method for replacing a semiconductor chip as claimed in claim 1, in which the bump electrodes on said substrate and the bump electrodes for bonding said another chip to the bump electrodes on said substrate comprises solder, and the latter bump electrodes are attached to said another chip.

6. The method for replacing a semiconductor chip as claimed in claim 5, further including the step of depositing a solder, having a melting point lower than the melting points of the solder bumps on said substrate and the solder bumps of said another chip, to at least one of the solder bumps on said substrate and the solder bumps of said another chip.

7. The method for replacing a semiconductor chip as claimed in claim 6, in which the bonding of said another chip is performed by exposing said substrate to a temperature higher than the melting point of said deposited solder but lower than the melting points of the solder bumps of said another chip and the solder bumps on said substrate.

* * * * *